(12) United States Patent
Lin et al.

(10) Patent No.: US 12,463,123 B2
(45) Date of Patent: Nov. 4, 2025

(54) MULTI-CHIP SYSTEM-IN-PACKAGE

(71) Applicant: SEMICONDUCTOR COMPONENTS INDUSTRIES, LLC, Phoenix, AZ (US)

(72) Inventors: Yusheng Lin, Phoenix, AZ (US); Takashi Noma, Ota (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 388 days.

(21) Appl. No.: 17/661,420

(22) Filed: Apr. 29, 2022

(65) Prior Publication Data

US 2022/0359360 A1 Nov. 10, 2022

Related U.S. Application Data

(60) Provisional application No. 63/184,386, filed on May 5, 2021.

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 21/561* (2013.01); *H01L 21/76898* (2013.01); *H01L 23/3128* (2013.01); *H01L 23/3157* (2013.01); *H01L 23/481* (2013.01); *H01L 24/02* (2013.01); *H01L 24/06* (2013.01); *H01L 24/94* (2013.01); *H01L 24/97* (2013.01); *H01L 25/0652* (2013.01); *H01L 25/0655* (2013.01); *H01L 25/50* (2013.01); *H01L 24/11* (2013.01); *H01L 24/16* (2013.01); *H01L 24/81* (2013.01); *H01L 25/16* (2013.01); *H01L 25/18* (2013.01);
(Continued)

(58) Field of Classification Search
None
See application file for complete search history.

(56) References Cited

U.S. PATENT DOCUMENTS

| | | | | |
|---|---|---|---|---|
| 11,342,255 B2 * | 5/2022 | Chen | ................. | H01L 23/49811 |
| 2008/0079157 A1 * | 4/2008 | Kurita | ................. | H01L 23/5389 |
| | | | | 257/E25.011 |

(Continued)

*Primary Examiner* — Long Pham
(74) *Attorney, Agent, or Firm* — Brake Hughes Bellermann LLP

(57) ABSTRACT

A system-in-package includes an interposer substrate having a first side and a second side opposite the first side, and a redistribution layer disposed on the first side. The redistribution layer includes a plurality of contact pads and a plurality of interconnections disposed on the first side. The plurality of interconnections is electrically connected to a plurality of terminals disposed on the second side opposite the first side. A first semiconductor die is disposed on the first side and electrically coupled to a first of the plurality of contact pads and a first of the plurality of interconnections disposed on the first side of the interposer substrate. A second semiconductor die is disposed on the first side. The second semiconductor die is electrically coupled to a second of the plurality of contact pads and a second of the plurality of interconnections disposed on the first side of the interposer substrate.

24 Claims, 10 Drawing Sheets

(51) Int. Cl.
  *H01L 21/56* (2006.01)
  *H01L 21/768* (2006.01)
  *H01L 23/00* (2006.01)
  *H01L 23/31* (2006.01)
  *H01L 23/48* (2006.01)
  *H01L 25/00* (2006.01)
  *H01L 25/065* (2023.01)
  H01L 25/16 (2023.01)
  H01L 25/18 (2023.01)

(52) U.S. Cl.
  CPC ............ *H01L 2224/02372* (2013.01); *H01L 2224/02381* (2013.01); *H01L 2224/0239* (2013.01); *H01L 2224/06182* (2013.01); *H01L 2224/16145* (2013.01); *H01L 2224/16227* (2013.01)

(56) References Cited

U.S. PATENT DOCUMENTS

| | | | |
|---|---|---|---|
| 2008/0315372 A1 | 12/2008 | Kuan et al. | |
| 2015/0162220 A1* | 6/2015 | Chou | H01L 24/81 438/124 |
| 2017/0117200 A1* | 4/2017 | Kim | H01L 24/97 |
| 2018/0096963 A1* | 4/2018 | Pendse | H01L 24/06 |
| 2018/0226312 A1* | 8/2018 | Kim | H01L 23/5386 |
| 2019/0115314 A1 | 4/2019 | Liu | |
| 2024/0203856 A1* | 6/2024 | Chen | H01L 25/18 |

* cited by examiner

MULTI-CHIP SYSTEM-IN-PACKAGE

RELATED APPLICATION

This application claims priority to, and the benefit of, U.S. Provisional Patent Application No. 63/184,386, filed May 5, 2021, which is hereby incorporated by reference in its entirety herein.

TECHNICAL FIELD

This description relates to packaging of semiconductor die.

BACKGROUND

For an electronics system requiring the functions of two or more integrated circuits (ICs), the multiple ICs can be mounted on a printed circuit board, and wire bonds can carry electrical signals between the multiple ICs. A system-in-package (SiP) combines two or more integrated circuits (ICs) inside a single package. Combining the two or more inside a single package can shorten distances that electrical signals have to travel between the multiple ICs.

SUMMARY

In a general aspect, a system-in-package includes an interposer substrate having a first side and a second side opposite the first side, and a redistribution layer disposed on the first side. The redistribution layer includes a plurality of contact pads and a plurality of interconnections disposed on the first side. The plurality of interconnections is electrically connected to a plurality of terminals disposed on the second side opposite the first side. A first semiconductor die is disposed on the first side and electrically coupled to a first of the plurality of contact pads and a first of the plurality of interconnections disposed on the first side of the interposer substrate. A second semiconductor die is disposed on the first side. The second semiconductor die is electrically coupled to a second of the plurality of contact pads and a second of the plurality of interconnections disposed on the first side of the interposer substrate.

In a general aspect, a method includes forming a wafer-level interposer substrate having a first side and a second side opposite the first side, forming a through-semiconductor via (TSV) extending between the first side and the second side of the wafer-level interposer substrate, and flip chip mounting at least two semiconductor die on the first side of the wafer-level interposer substrate. The method further includes encapsulating the at least two semiconductor die mounted on the first side of wafer-level interposer substrate in a layer of molding material, and singulating a wafer-level assembly of the wafer-level interposer substrate and the layer of molding material encapsulating the at least two semiconductor die mounted on the wafer-level interposer substrate to produce at least one individual system-in-package including the at least two semiconductor die.

In a general aspect, a method includes disposing a redistribution layer including contact pads and interconnection pads on a first side of a semiconductor wafer, mounting a first semiconductor die and a second semiconductor die on the redistribution layer on the first side of the semiconductor wafer, and encapsulating the first semiconductor die and the second semiconductor die on the first side of the semiconductor wafer in a layer of molding material. The method further includes thinning the semiconductor wafer from a second side opposite the first side, forming at least a through-semiconductor via (TSV) extending between the first side and the second side of the thinned semiconductor wafer, and forming an interconnection including a terminal on the second side of thinned semiconductor substrate. The method further includes singulating an assembly of the semiconductor wafer and the layer of molding material to produce an individual unit of a system-in-package (SiP) that includes the first semiconductor die and the second semiconductor die integrated on the thinned semiconductor substrate.

The details of one or more implementations are set forth in the accompanying drawings and the description below. Other features will be apparent from the description and drawings, and from the claims.

Figure 1:
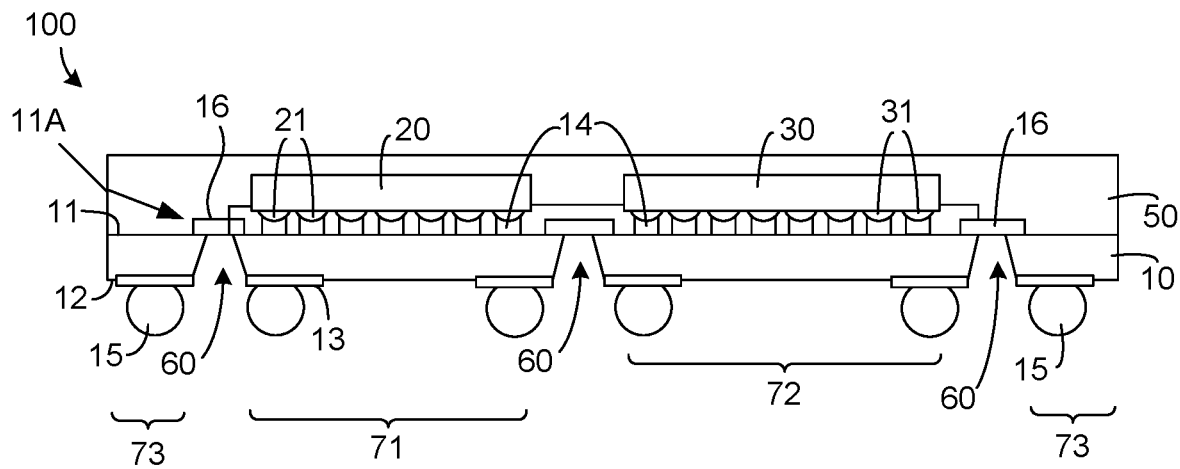
FIG. 1 schematically illustrates, in a cross-sectional view, an example system-in-package (SiP) structure, in accordance with the principles of the present disclosure.

In the drawings, which are not necessarily drawn to scale, like reference symbols indicate like and/or similar components (elements, structures, etc.) in the different views shown. The drawings generally illustrate, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are provided only for context and cross reference between related views. Also, not all like elements in the drawings are specifically marked or labeled with a reference symbol when multiple instances of an element are illustrated in different drawings.

DETAILED DESCRIPTION

The shrinking features and increasing functionality of modern integrated circuits (ICs) can result in longer and thinner interconnections (wires) between the ICs and increase the time it takes for electrical signals to move around an IC chip. By packaging different chips together, connected through an interposer substrate (e.g., a semiconductor substrate) or through-silicon via, the electrical signals can be speeded up using shorter wire distances and wider wire conduits.

A system-in-package (SiP) structure combining multiple ICs on an interposer substrate is described herein. The multiple ICs in the SiP may include two or more semiconductor die (chips) containing different circuits based on various process nodes (e.g., CMOS, SiGe, BiCMOS, etc.). The different circuits may include digital and/or analog circuits. The interposer substrate may be a semiconductor substrate (e.g., a silicon substrate). Further, wafer-level integration techniques for fabricating the SiP are described herein.

FIG. 1 illustrates, in a cross-sectional view, an example system-in-package (SiP) structure (e.g., SiP 100), in accordance with the principles of the present disclosure.

SiP 100 includes multiple integrated circuit (IC) die (semiconductor die) (e.g., die 20 and die 30) mounted of a wafer-level interposer substrate (e.g., interposer substrate 10), and encapsulated in a layer of molding material (e.g., layer 50). Interposer substrate 10 may, for example, be a silicon wafer. Apertures or through-semiconductor-vias (TSVs) (e.g., TSV 60) are formed in interposer substrate 10. The apertures or TSVs can provide conductive pathways for electrical interconnections between a first side (e.g., first side 11) and a second side (e.g., second side 12) of the interposer substrate.

In example implementations, die 20 and die 30 are mounted on the first side of the interposer substrate. Die 20 and die 30 may, for example, include contact pads 21 and contact pads 31 for electrical connections to the circuits (not shown) included in the die. The first side 11 of the interposer substrate can be patterned and metalized to form at least one redistribution layer (RDL) (e.g., RDL 11A) disposed on the first side. The RDL can be a layer of wiring metal interconnects that can redistribute I/O access to different parts of die 20 and die 30. In the example shown in FIG. 1, RDL 11A may, for example, include contact pads 14 and interconnections 16.

In example implementations, die 20 and die 30 may be mounted on the first side of the interposer substrate, for example, in a first chip area 71 and a second chip area 72, respectively. An edge area 73 of interposer substrate 10 is arranged at the circumference of the first and second chip area 71, 72. Each of die 20 and die 30 may be mounted a flip chip orientation. In the flip chip orientation, contact pads 21 and 31 (of die 20 and die 30) face toward interposer substrate 10 and are coupled to contact pads 14 and interconnections 16 disposed on the first side.

In example implementations, the TSVs (e.g., TSV 60) are disposed in areas outside the first and second chip areas 71, 72 (e.g., at outer edges of the first and second chip areas 71, 72). FIG. 1 shows, for example, the TSVs (e.g., TSV 60) formed between the first chip area 71 and edge area 73, between the first and second chip areas 71 and 72, and between the second chip area 72 and edge area 73. In other words, interposer substrate 10 is continuous (e.g., unbroken or having a same thickness) in areas 71, 72 underlying die 20 and die 30.

In example implementations, terminals 13 are disposed on the second side (e.g., second side 12) of the interposer substrate. Interconnections 16 on the first side (e.g., first side 11) are electrically connected to terminals 13 by conductive pathways in the TSVs (e.g., TSVs 60) extending between the first side and the second side of the interposer substrate. Terminals 13 can provide external I/O access to die 10 and die 30 in SiP 100 via TSVs 60. In example implementations, conductive bumps (e.g., solder bumps 50) may be attached to terminals 13 for external electrical connections (e.g., via a printed circuit board (PCB) (not shown)) to SiP 100.

In example implementations of SiP 100, die 20 and die 30 may each include a semiconductor integrated circuit, such as a processor, a memory, a power management integrated circuit, a transceiver circuit and/or a discrete semiconductor device (e.g., a power discrete product). The mounting of the first and second semiconductor die 20, 30 in a flip-chip orientation can result in performance improvements due to a reduction of the interconnect lengths (e.g., vertical interconnect lengths).

In example implementations, interposer substrate 10 is made of semiconductor material (e.g., silicon). While not shown in FIG. 1, interposer substrate 10 can include an active or passive component (e.g., a diode, a pin diode, a transistor, a trench-FET, a capacitor, a resistor, and an inductor, etc.). Such an active or passive component may be arranged, for example, to function as a filter or for any other electrical function or purpose. Further, in some implementations, interposer substrate 10 may be a doped substrate and may, for example, include N-type or P-type doping in specific regions or throughout the substrate.

In some implementations, TSVs 60 may be formed by wet chemical etching or non-directional dry etching. In such implementations, the TSVs (e.g., TSV 60) may have a wider opening on the second side 12 than on the first side 11 of interposer substrate 10 and have slanting sidewalls, as shown FIG. 1. In some implementations, the TSVs may be formed, for example, by laser ablation or directional dry etching to have more vertical sidewall profiles.

In example implementations, the sidewalls of TSVs (e.g., TSV 60) may he lined with an electrically conductive layer (or the TSVs filled or partially filled with electrically conductive material) to provide a conductive pathway for electrical interconnections between a first side (e.g., first side 11) and a second side (e.g., second side 12) of the interposer substrate. An example electrically conductive layer or material may, for example, be a laminate of titanium nitride (TiN) and aluminum (Al) or copper (Cu), or a metal paste (e.g., a silver paste). The conductive layer may be formed, for example, by electrochemical deposition, sputtering and/or screen printing.

In example implementations, the TSVs are formed after thinning of a starting interposer substrate (a semiconductor wafer). The interposer substrate may be thinned to a thickness, for example, of about 50 µm or less (e.g., 35 µm or less). In some implementations, the layer of molding material (e.g., layer 50) used for encapsulation of die 20 and die 30 may have a thickness, for example, in a range of about 100 µm to about 150 µm.

Figure 2:
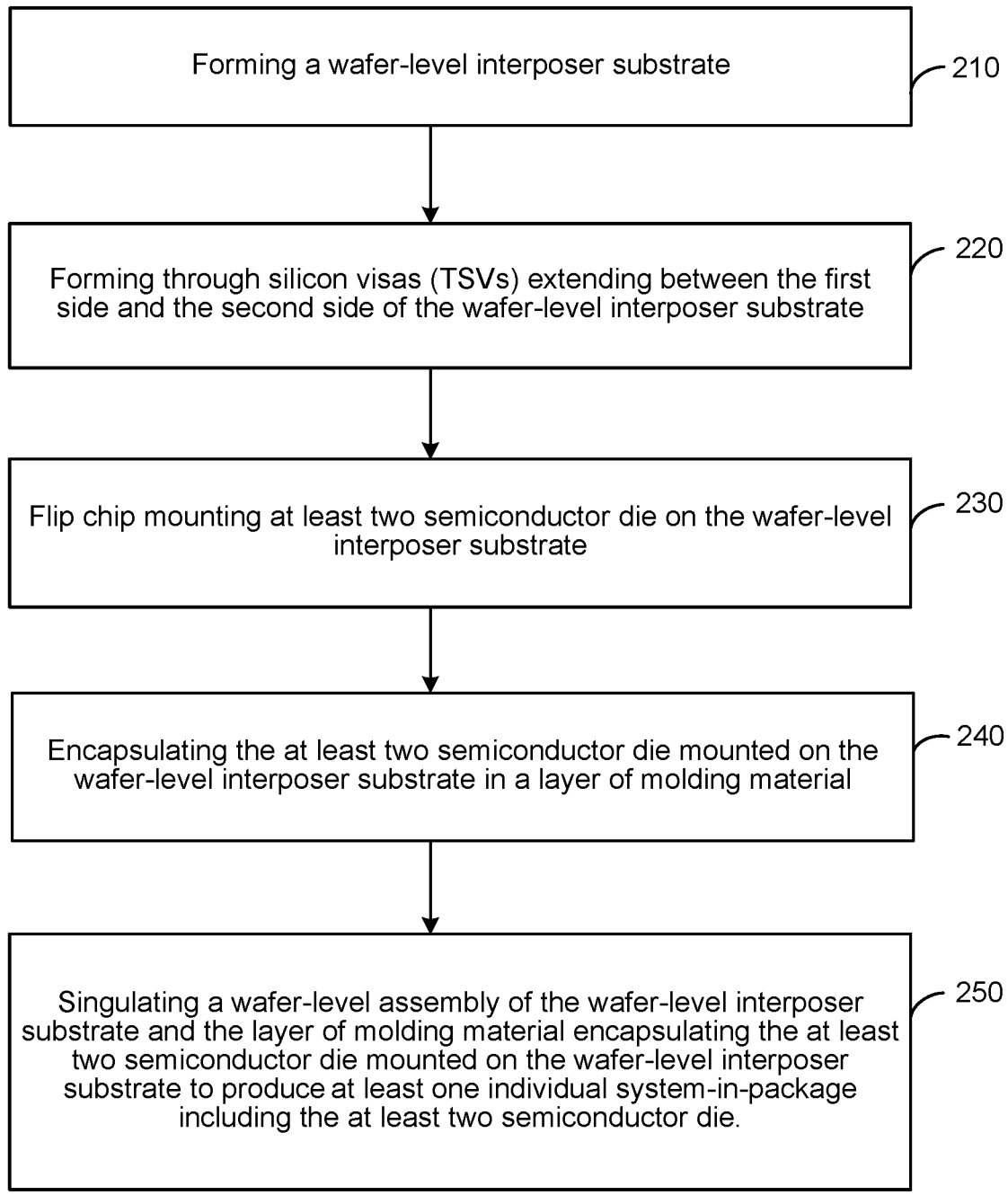
FIG. 2 illustrates an example method for fabricating a system-in-package (SiP) structure, in accordance with the principles of the present disclosure.

FIG. 2 shows an example method 200 for fabricating an example system-in-package (SiP) structure (e.g., SiP 100, FIG. 1), in accordance with the principles of the present disclosure.

Method 200 involves forming a wafer-level interposer substrate having a first side and a second side opposite the first side (210). In example implementations, the wafer-level interposer substrate may be a silicon wafer that is thinned to a thickness, for example, of less than about 100 µm (e.g., 50 µm, 30 µm). A redistribution layer (including contact pads and interconnection pads) may be disposed on a first side and external contact terminals may be disposed on the second side of the wafer-level interposer substrate. Method 200 may further include forming a through-semiconductor via (TSV) extending between the first side and the second side of the wafer-level interposer substrate (220). The TSV may be lined with, or filled with conductive material, to establish electrical connections between the first side and the second side of the wafer-level interposer substrate. Method 200 may further include flip chip mounting at least two semiconductor die on the first side of the wafer-level interposer substrate (230) and encapsulating the at least two semiconductor die mounted on the first side of the wafer-level interposer substrate in a layer of molding material (240). Method 200 may further include singulating a wafer-level assembly of the wafer-level interposer substrate and the layer of molding material encapsulating the at least two semiconductor die mounted on the wafer-level interposer substrate to produce at least one individual system-in-package including the at least two semiconductor die (250). The singulation step can produce an individual unit of the SiP that includes, for example, two different die (e.g., die 20 and die 30) integrated on the interposer substrate in the individual unit package.

In example implementations, in method 200, forming a wafer-level interposer substrate 210 may include forming support structures to mechanically reinforce, for example, a rigidity of the interposer substrate during SiP fabrication.

In example implementations, the wafer-level interposer substrate used in method 200 may be mechanically reinforced during at least some stages of fabrication of the SiP. For example, protrusion supports may be disposed on the second side of the wafer-level interposer substrate to mechanically reinforce the substrate at least through step 240 (of encapsulating the semiconductor die mounted on the wafer-level interposer substrate in a layer of molding material). The protrusion supports may be removed during singulation of the assembly to produce individual SiP.

FIGS. 3A through 3D schematically illustrate a multi-die SiP package (e.g., SiP package 100, FIG. 1) including two die (e.g., die 20 and die 30) at various stages of construction on an interposer substrate (e.g., interposer substrate 10), or after the different steps of method 200 for fabricating a SiP package. FIGS. 3A through 3D show cross-sectional views of the SiP (SiP package 100, FIG. 1) at the various stages of construction using a thinned interposer substrate without protrusion supports for mechanical reinforcement during the fabrication stages.

Figure 3A:
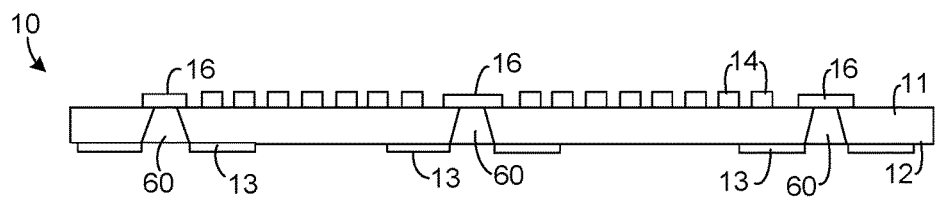
FIGS. 3A through 4D schematically illustrate cross-sectional views of a multi-die SiP package at various stages of construction on an interposer substrate.

FIG. 3A shows an example interposer substrate (e.g., interposer substrate 10)) at a first stage of construction (e.g., in method 200, before step 210). Interposer substrate 10 may be made of a semiconductor material wafer (e.g., a six-inch diameter, an eight-inch diameter, or a twelve-inch diameter silicon wafer) having a first side 11 and a second side 12. Interposer substrate 10 may be thinned (e.g., by back grinding, etching, or chemical mechanical polishing, etc.) to a small thickness (e.g., 50 μm).

A redistribution layer (e.g., RDL 11A) is formed on the first side 11 (e.g., by patterning and metal deposition). The metal deposition may, for example, include metal deposition by electroless deposition, electroplating, sputtering, evaporation, or other metal deposition technique. Redistribution layer (e.g., RDL 11A) may include contact pads 14 and interconnection pads (e.g., interconnects 16) disposed on first side 11. Conductive terminals (e.g., terminals 13) may be disposed on the second side (e.g., second side 12) of the interposer substrate. Terminals 13 may be made of metal (e.g., Cu) or other conductive material. Terminals 13 (like RDL 11A) may be made by lithographic patterning and metal deposition processes.

Conductive through-semiconductor vias (e.g., TSVs 60) may be formed from second side 12 to first side 11 to electrically connect terminals 13 (on second side 12) to the interconnects 16 disposed on first side 11. The TSVs may be formed, by wet etching, dry etching or a combination of wet etching and dry etching. In example implementations, the TSVs may be lined, filled and/or partially filled with conductive material. The electrically conductive layer or material may, for example, be a laminate of titanium nitride (TiN) and aluminum (Al) or copper (Cu), or a metal paste (e.g., a silver paste). The conductive layer may be formed, for example, by electrochemical deposition, sputtering and/or screen printing.

In some implementations, the TSVs may initially extend only partially through the thickness of the interposer substrate and may be then further extended through a full thickness of the interposer substrate only after further stages (e.g., after molding encapsulation of the die) in the construction of SiP 100.

Figure 3B:
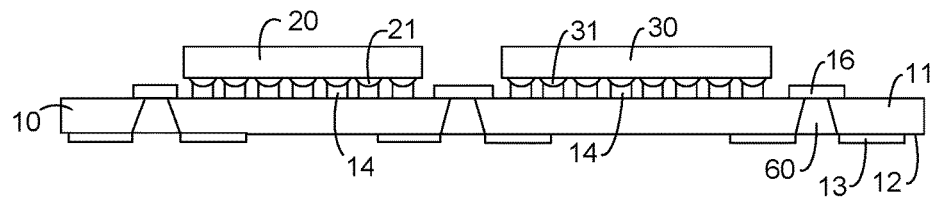
Figure 3C:
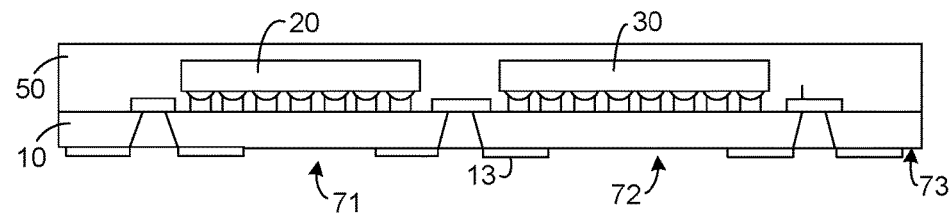

FIG. 3B shows SiP 100 at a second stage of construction after the two die (e.g., die 20 and die 30) are mounted on interposer substrate 10. As shown in FIG. 3B, each of the die 20, 30 are mounted in a flip-chip orientation with their contact pads 21, 31 facing the corresponding contact pads 14 on first side 11 of interposer substrate 10. Electrical connections between the contact pads 21, 31 of the die and the corresponding contact pads 14 on first side 11 of interposer substrate 10 may be established, for example, by copper-to-copper bumps, solder balls, micro-solder bumps, or by using a solder paste. As shown in FIG. 3C, die 20 is arranged on a first chip area 71 of interposer substrate 10 and die 30 is arranged on a second chip area 72 of interposer substrate 10. An edge area 73 of interposer substrate 10 is arranged at the circumference of first and second chip areas 71, 72.

FIG. 3C shows SiP 100 at a third stage of construction after die 20, 30 that are mounted on interposer substrate 10 are encapsulated in a layer of molding material (e.g., layer 50). In example implementations, wafer-level compression mold and film assist techniques may be used to encapsulate die 20 and 30 in the layer of molding material (e.g., layer 50).

In example implementations, an underfill material (not shown in FIG. 3C) may be disposed in gaps between interposer substrate 10 and the flip chip mounted die (e.g., die 20, 30) encapsulated in the layer of molding material.

Figure 3D:
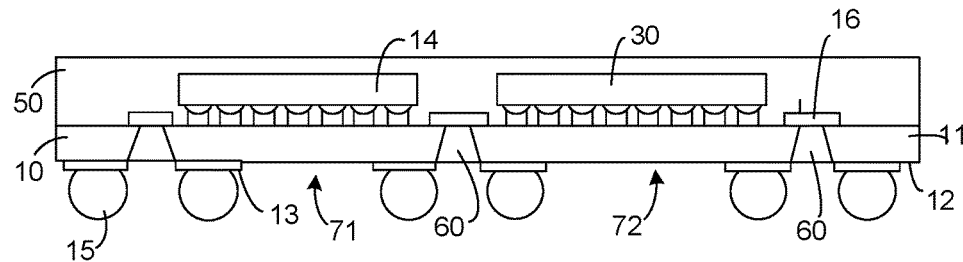

FIG. 3D shows SiP 100 at a fourth stage of construction. At this stage, after molding but prior to singulation and bumping, a final electrical test of the functions of die 20 and 30 may be performed using one or more of the terminals (e.g., terminals 13). After satisfactory testing, solder bumps (e.g., solder bump 15) may be applied to terminals 13 on the second side (e.g., second side 12) of the interposer substrate. Next, the assembly may be singulated (e.g., using a singulation saw) through edge area 73 of interposer substrate 10 to produce individual units of SiP 100. Each individual unit of the SiP includes the two die 20 and 30, as shown, for example, in FIG. 1 and FIG. 3D.

Figure 11A:
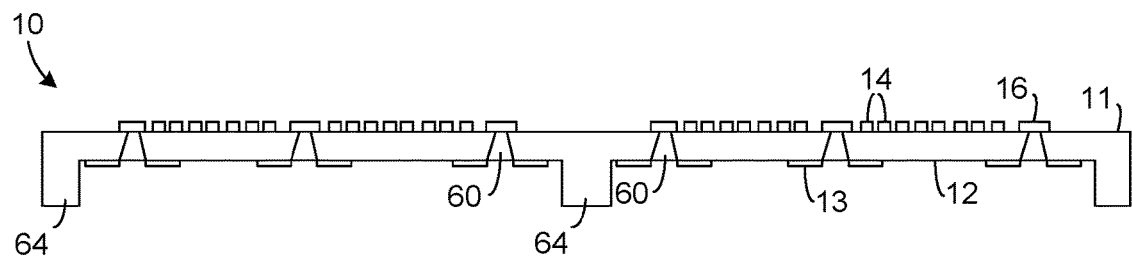
FIGS. 11A, 11B and 11C illustrate a multi-die SiP package at various stages of construction.
Figure 11B:
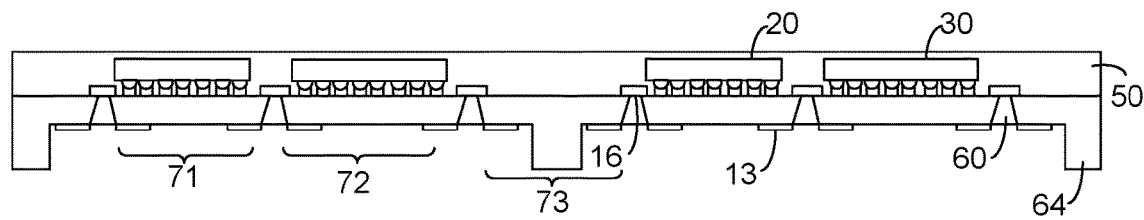
Figure 11C:
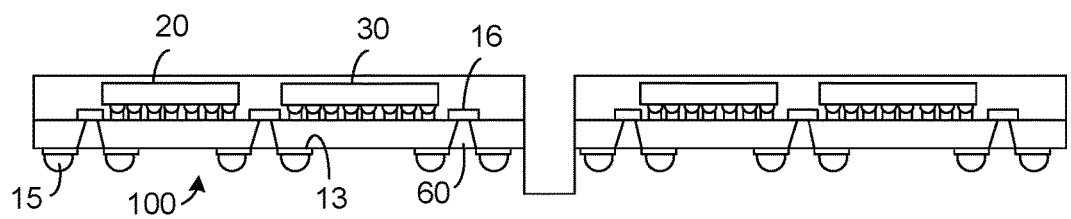

FIGS. 11A through 11C schematically illustrate the multi-die SiP package (e.g., SiP package 100, FIG. 1) at the various stages of construction on an interposer substrate (e.g., interposer substrate 10) that has protrusion supports for mechanical reinforcement during at least some of the different stages of construction.

FIG. 11A, FIG. 11B and FIG. 11C show the SiP package at stages of construction corresponding, for example, to the stages of construction shown in FIG. 3A, FIG. 3C and FIG. 3D, respectively.

As shown in FIG. 11A and FIG. 11B, in some implementations, substrate protrusions 64 are disposed on the second side (e.g., second side 12) of substrate 10. The substrate protrusions 64 may, for example, have a form of posts (that may extend generally perpendicular to the second side) having a vertical height H (in the z direction). The vertical height H of substrate protrusions 64 may enable positioning of the substrate 10 on a tape carrier during the stages of construction of the SiP.

Figure 6A:
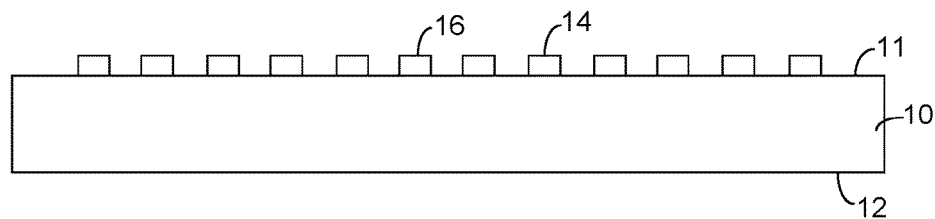
FIGS. 6A through 6G schematically illustrate a multi-die SiP package at various stages of construction on an interposer substrate.
Figure 6B:
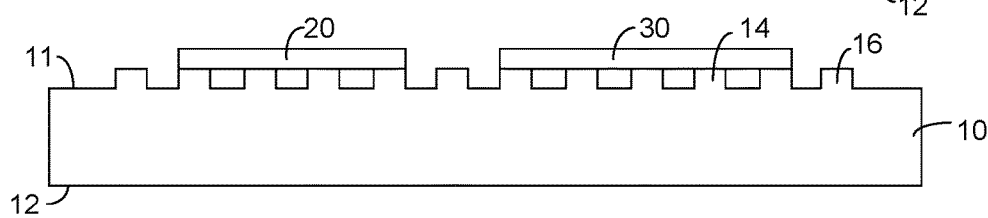
Figure 6C:
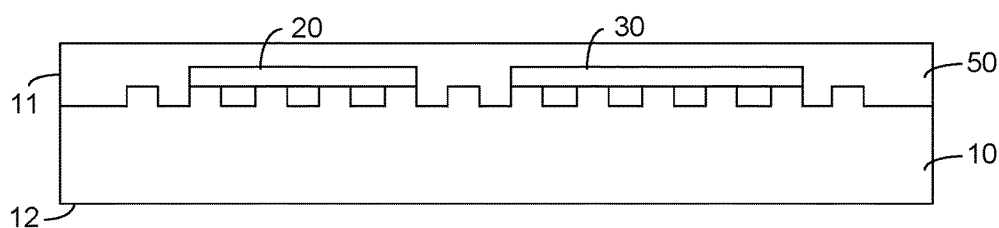
Figure 6D:
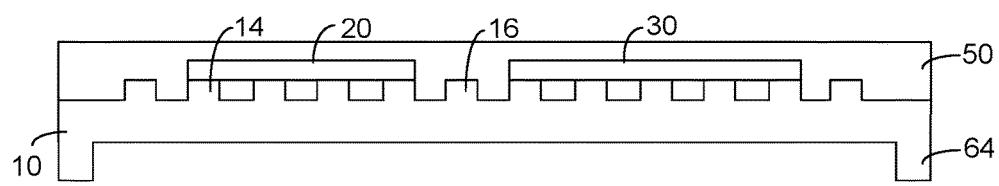
Figure 6E:
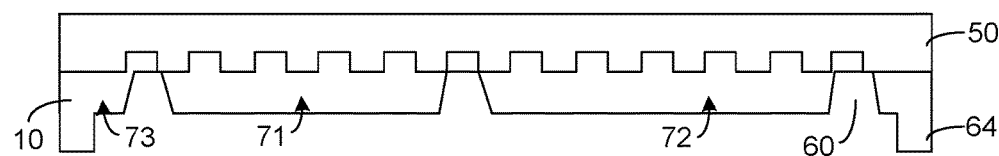
Figure 6F:
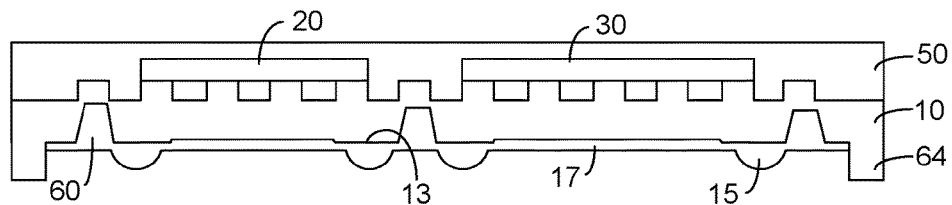
Figure 6G:
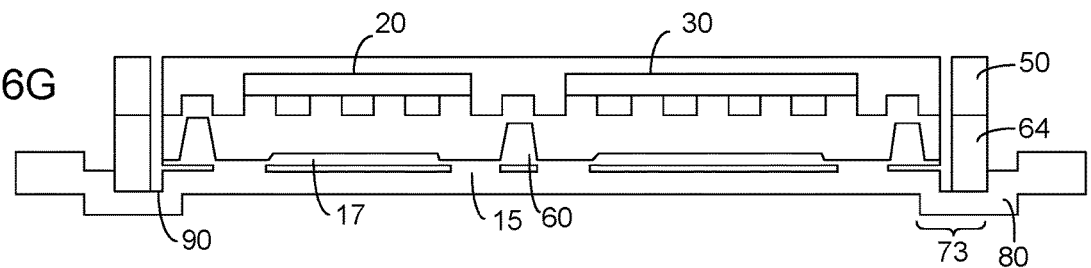

An example tape carrier (e.g., tape carrier 80) is schematically shown in FIG. 6G. The tape carrier (e.g., tape carrier 80) may be elastic in the one or more lateral directions to separate individual units of the SiP after singulation of a single package out of a wafer-level assembly and to allow picking up an individual unit of the SiP without damage to neighboring individual units of the SiP. Alternatively, or additionally, the tape (e.g., tape carrier 80) may be configured for transport of the individual SiP units.

As shown in FIGS. 11A-C, the substrate protrusions 64 may be disposed between each unit of the interposer substrate 10 that will form a separate individual unit of SiP 100. The substrate protrusions 64 may be disposed in areas that will not become part of a resulting individual unit of SiP 100. The substrate protrusions may further contribute to the rigidity of the thinned interposer substrate, reducing a risk of warpage and/or cracking.

In example implementations, the substrate protrusions 64 may have cross sectional shapes in the form of a circle, or a rectangular or square block, or a cross. In example implementations, the substrate protrusions 64 may be disposed about corners of a unit area or region in the interposer substrate 10 designated to be included in an individual unit of the SiP. Each unit area or region may be supported by up to four substrate posts at the corners of the unit area or region. In some example implementations, a substrate protrusion 64 (e.g., in the form of a substrate post) may be arranged in between a first and a second unit area or region. In some example implementations, a substrate protrusion 64 may extend substantially or entirely around the unit area or region designated to be included in an individual unit of the SiP.

The thinned portion of interposer substrate 10 can be a membrane extending between of the substrate protrusions 64. The substrate protrusions 64 may provide strength to the interposer substrate 10, for example, during molding processes, and aid in withstanding warpage that might otherwise occur.

In example implementations, the substrate protrusions 64 may be formed on edges of the interposer substrate in the form of an edge ring (i.e., a Taiko edge ring) formed by a Taiko wafer back grinding processes that may be used to thin the substrate. Additionally, depending on the size of interposer substrate 10, additional substrate protrusions may be provided within the Taiko edge ring for mechanically reinforcing thinned portions of interposer substrate 10.

In some implementations, forming the wafer-level interposer substrate 210 (method 200, FIG. 2) may include forming a support structure (e.g., support structure 52) on a top of the interposer substrate.

FIGS. 4A through 4D schematically illustrate the multi-die SiP package (e.g., SiP package 100, FIG. 1) at various stages of construction on an interposer substrate (e.g., interposer substrate 10) that involve an additional step of film assisted molding to create a support structure (e.g., support structure 52) on a top of the interposer substrate.

In the film assisted molding process, in addition to forming RDL layer 11a, a protective film (e.g., a resist, polyimide or resin film) is applied to the first side (e.g., first side 11) of interposer substrate 10. The protective film may cover first side 11 over the first and second chip areas 71, 72. Portions of first side 11 over the edge areas 73 are not covered by the protective film. A molding compound can then be selectively spread over the portions of first side 11 over the edge areas 73 without covering the first and second chip areas 71, 72. The molding compound may form a wall or dam-like support structure (e.g., support structure 52) on the portions of first side 11 over the edge areas 73.

Figure 4A:
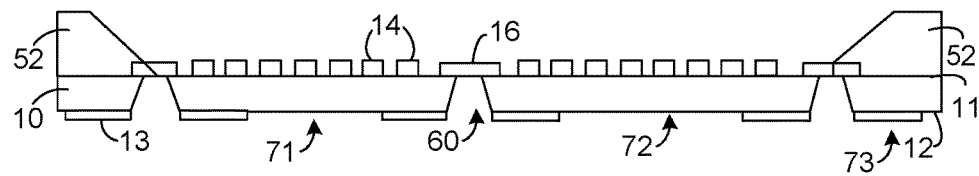

FIG. 4A shows, for example, a dam-like support structure (e.g., support structure 52) formed on the portions of first side 11 of interposer substrate 10 over the edge areas 73, at the first stage of construction. In example implementations, a dam-like support structure (e.g., support structure 52) may have a height corresponding to the thickness of the layer of molding material (e.g., layer 50) that may be used to encapsulate the die (e.g., die 20 and die 30) at a later stage of construction. In some example implementations, the dam-like support structure (e.g., support structure 520) may have a height that is greater than or less than the thickness of the layer of molding material (e.g., layer 50) that may be used to encapsulate the die (e.g., die 20 and die 30) at a later stage of construction.

While not shown in FIG. 4A, support structure 52 may extend over an area outside an individual unit of the interposer substrate that will be singulated into an individual unit of SiP 100 and up to an adjacent unit. An intermediate part of the support structure 52 outside the individual unit of the interposer substrate can be removed during singulation. Thus, support structure 52, to ensure rigidity of interposer substrate 10 during processing, may at least initially have vertical dimensions exceeding those of the encapsulation.

In some example implementations, support structure 52 may cover the TSV openings between first or second chip areas 71, 72 and edge areas 73. Such covering of the TSV openings may advantageously increase the rigidity of the interposer substrate 10 during processing, particularly prior to provision of the encapsulation.

Figure 4B:
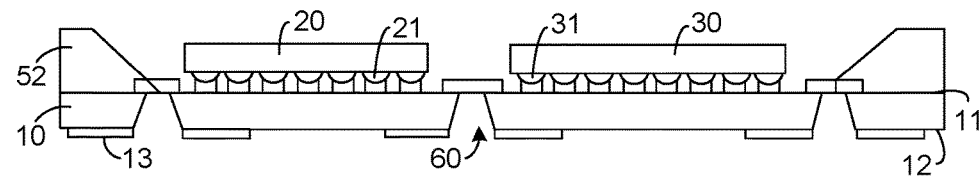

FIG. 4B shows, for example, the multi-die SiP package (e.g., SiP package 100, FIG. 1) at the second stage of construction in which first and second semiconductor die 20, 30 are mounted on first side 11 of interposer substrate 10.

Figure 4C:
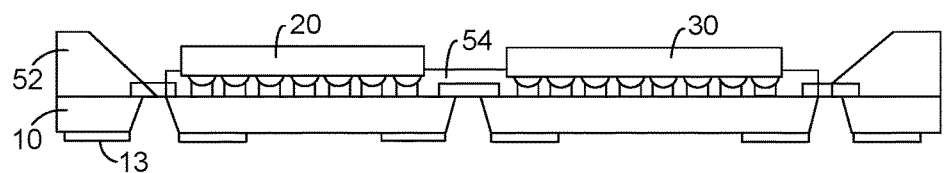

FIG. 4C shows, for example, the multi-die SiP package (e.g., SiP package 100, FIG. 1) after an underfill material (underfill layer 54) is disposed in gaps between interposer substrate 10 and the flip chip mounted die (e.g., die 20, 30).

Figure 4D:
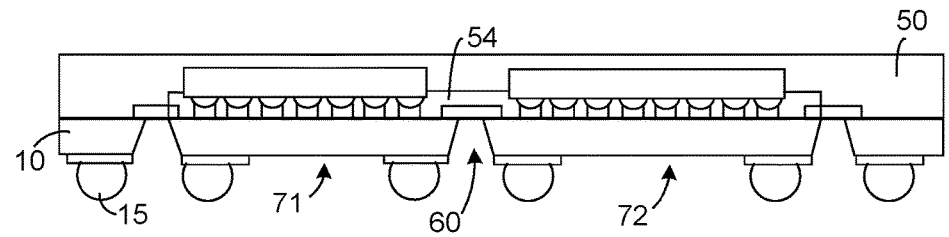

FIG. 4D shows at a third stage of construction after die 20, 30 that are mounted on interposer substrate 10 are encapsulated in a layer of molding material (e.g., layer 50) and solder balls 15 are attached to terminals 13 on the second side of interposer substrate 10. In example implementations, wafer-level compression mold and film assist techniques may be used to encapsulate die 20 and 30 in the layer of molding material (e.g., layer 50).

As shown in FIG. 4D, the final layer of molding material (e.g., layer 50) absorbs or subsumes support structure 52. In some implementations, the final layer of molding material (e.g., layer 50) may not completely subsume support structure 52, and portions of support structure 52 may remain visible in the package.

In example implementations, support structure 52 and the final layer of molding material (e.g., layer 50) may be made of a same or different mold material.

In example implementations, the final layer of molding material (e.g., layer 50) may be applied by a coating technique instead of a mold compression technique.

In example implementations, a surface of surface support structure 52 may be grooved or otherwise roughened to promote adhesion of the encapsulation layer of molding material (e.g., layer 50).

In example implementations, the final layer of molding material (e.g., layer 50) may be planarized (not shown), for example, by grinding. The planarization of the encapsulation layer on the first side 11 of interposer substrate 10 may lead to better control over the positioning of metal patterns and/or solder material on the second side of interposer substrate 10 at a later stage of construction.

Figure 11D:
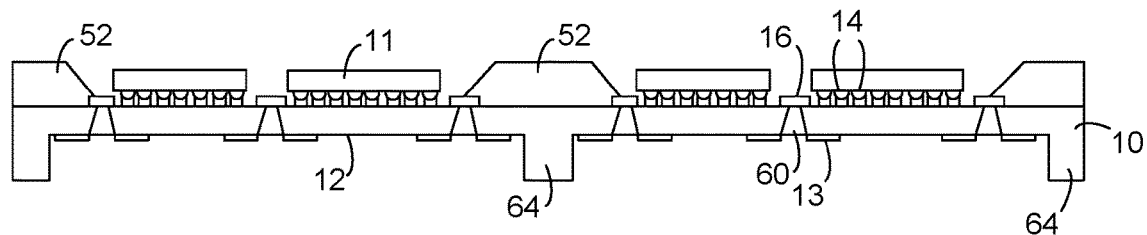
FIG. 11D illustrates a mechanically reinforced interposer substrate at a first stage of construction of a multi-die SiP package.

In example implementations, interposer substrate 10 used in fabricating SiP 100 may be mechanical reinforced by both one or more substrate protrusions 64 on second side 12 and dam-like support structure (e.g., support structure 52) on the first side 11. FIG. 11D (like FIG. 4A) shows, for example, a mechanically reinforced interposer substrate 10 at a first stage of construction of a multi-die SiP package (e.g., SiP package 100, FIG. 1). In the example shown in FIG. 11D interposer substrate 10 used for fabricating SiP 100 is mechanical reinforced by both one or more substrate protrusions 64 on second side 12 and by dam-like support structures (e.g., support structure 52) on the first side 11.

In some implementations, the dam-like support structure (e.g., support structure 52) may also be used on the second side 12 supplementing or replacing substrate protrusions 64 on second side 12. As discussed with reference to FIG. 11A-C hereinabove, the substrate protrusions 64 may aid in providing strength during the assembly process, for instance during the molding step. The combination of substrate protrusions 64 and support structure 52 may provide a strong structural frame in between of which thinned interposer substrate 10 extends as a membrane.

Figure 5:
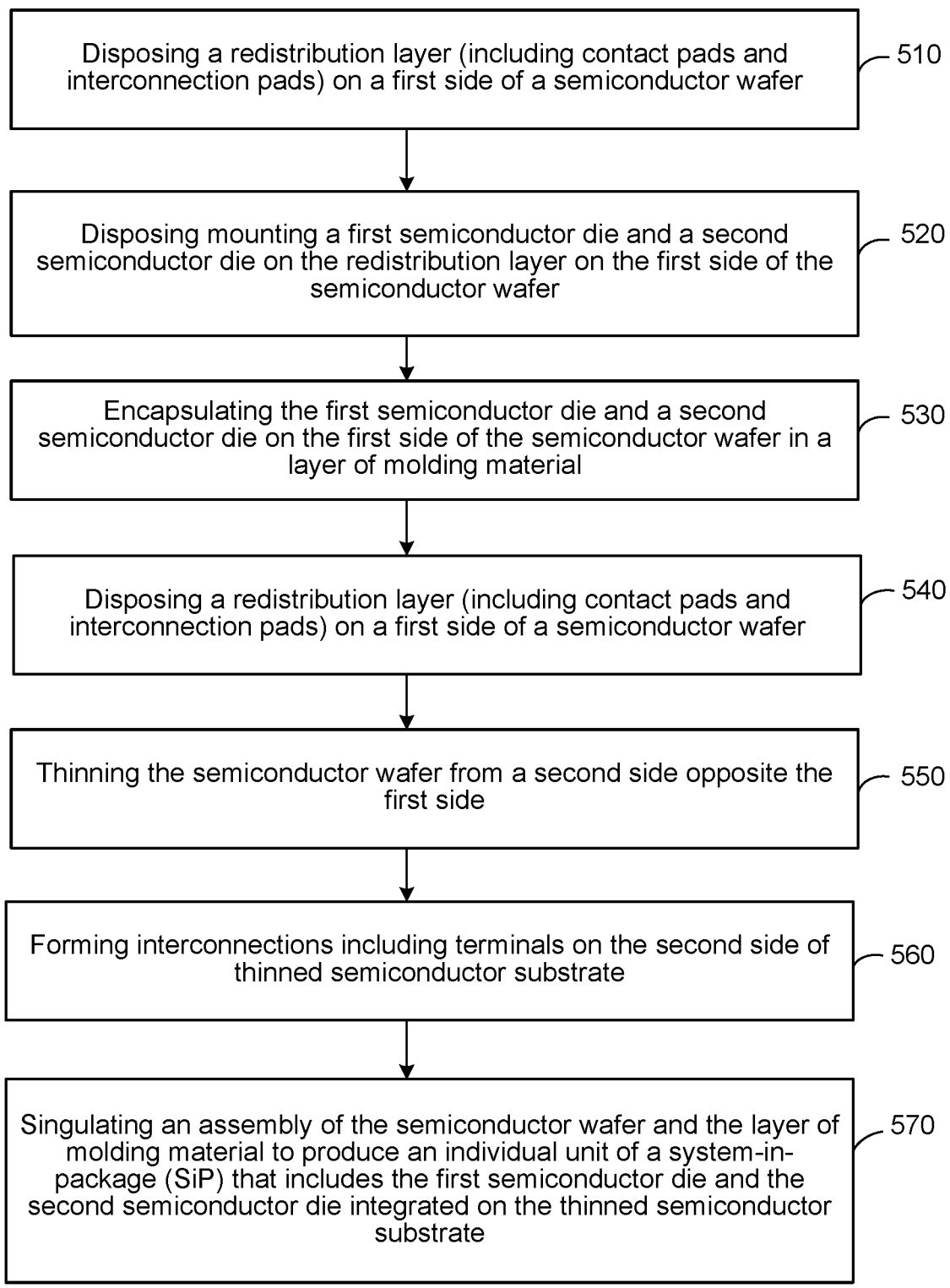
FIG. 5 illustrates another example method for fabricating an example system-in-package (SiP) structure, in accordance with the principles of the present disclosure.

FIG. 5 shows another example method 500 for fabricating an example system-in-package (SiP) structure (e.g., SiP 100, FIG. 1), in accordance with the principles of the present disclosure.

Method 500 involves disposing a redistribution layer (including contact pads and interconnection pads) on a first side of a semiconductor wafer (510), mounting a first semiconductor die and a second semiconductor die on the redistribution layer on the first side of the semiconductor wafer (520), and encapsulating the first semiconductor die and a second semiconductor die on the first side of the semiconductor wafer in a layer of molding material (530). Method further involves thinning the semiconductor wafer from a second side opposite the first side (540). The thinning may create substrate protrusions extending from the second side of the thinned the semiconductor wafer. Method 500 may further include forming at least a through-semiconductor via (TSV) extending between the first side and the second side of the thinned semiconductor wafer (550). The TSV may be lined with, or filled with conductive material, to establish electrical connections between the first side and the second side of the semiconductor substrate. Method 500 may further include forming an interconnection including a terminal on the second side of thinned semiconductor substrate (560). Method 500 may further include singulating an assembly of the semiconductor wafer and the layer of molding material to produce an individual unit of a system-in-package (SiP) that includes the first semiconductor die and the second semiconductor die integrated on the thinned semiconductor substrate (570). The singulation step can produce an individual unit of the SiP that includes, for example, two different die (e.g., die 20 and die 30) integrated on the thinned semiconductor substrate in the individual unit package.

FIGS. 6A through 6G schematically illustrate a multi-die SiP package (e.g., SiP package 100, FIG. 1) including two die (e.g., die 20 and die 30) at various stages of construction on an interposer substrate (e.g., interposer substrate 10), or after the different steps of method 500 for fabricating a SiP package. FIGS. 6A through 6G show cross-sectional views of the SiP (SiP package 100, FIG. 1) at the various stages of construction using an interposer substrate that is prepared or thinned at the last stages of construction.

FIG. 6A, shows for example, a wafer-level interposer substrate (e.g., interposer substrate 10) at a first stage of construction. Interposer substrate 10 may, for example, be a semiconductor material wafer (e.g., a six-inch diameter, an eight-inch diameter, or a twelve-inch diameter silicon wafer) having a first side 11 and a second side 12. Interposer substrate 10 is not thinned at this stage of construction. A starting thickness of interposer substrate 10 may depend on the diameter of the silicon wafer and may be in a range of about 625 µm to about 775 µm.

A redistribution layer (e.g., RDL 11A) is formed on the first side 11 (e.g., by patterning and metal deposition). Redistribution layer (e.g., RDL 11A) may include contact pads 14 and interconnects 16 disposed on first side 11.

FIG. 6B shows SiP 100 at a second stage of construction, for example, with die 10 and die 20 mounted on RDL 11A on the first side 11 of the interposer substrate 10.

FIG. 6C shows SiP 100 at a third stage of construction, for example, after die 20, 30 that are mounted on interposer substrate 10 are encapsulated in a layer of molding material (e.g., layer 50).

In example implementations, a top side of the layer of molding material (e.g., layer 50) may be planarized (e.g., by grinding) (not shown). This planarization of the material may lead to better control over the positioning of metal patterns and/or solder material on the second side of the interposer substrate 10 at a later stage of construction.

FIG. 6D shows SiP 100 at a fourth stage of construction that involves thinning of the interposer substrate 10 from its second side 12. The thinning may be performed, for example, by a Taiko back grinding process or other process. This thinning may be performed in a manner to form substrate protrusions 64 (e.g., as substrate posts) on the backside of the thinned interposer substrate 10.

FIG. 6E shows SiP 100 at a fifth stage of construction involves generation of the conductive TSVs (e.g., TSV 60) extending from the second side 12 to the first side 11 of (the thinned) interposer substrate 10 and exposing interconnects 16 disposed on first side 11. The positions of the conductive TSVs (e.g., may further define first and second chip areas 71, 72 as well as edge areas 73 in the interposer substrate 10.

FIG. 6F shows SiP 100 at a sixth stage of construction involving formation of electrical interconnections in TSVs 60 and on second side 12 of the interposer substrate 10. The interconnects are at least on the second side 12 of the interposer substrate 10. In example implementations, a solder resist mask 17 may be applied in predefined pattern to define terminals 13 and fill TSVs 60. Solder balls 15 are attached to terminals 13.

FIG. 6G shows SiP 100 at a seventh stage of construction prior to singulation. As shown in FIG. 6G, the wafer-level molded interposer substrate (of FIG. 6F) is mounted onto a tape carrier 80. The substrate protrusions 64 are positioned in predefined areas on tape carrier 80 to enable a stable placement with sufficient clearance to avoid risk of damage to the second side 12 of the interposer substrate 10 and/or to the solder bumps 15 attached terminals 13 on the second side 12. The wafer-level molded interposer substrate may then be singulated while on the tape. The singulation process may remove substrate protrusions 64 from SiP 100 (as indicated, for example, by singulation cuts 90 shown in FIG. 6G).

Figure 7:
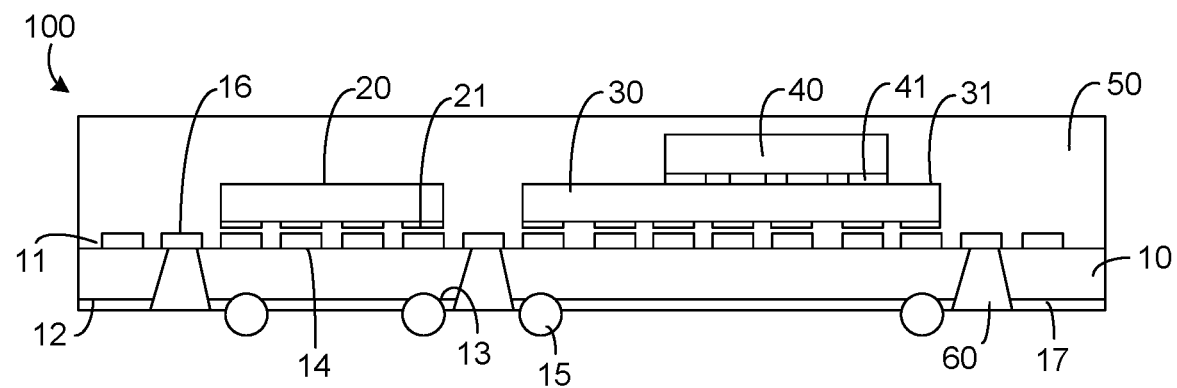
FIG. 7 illustrates, in a cross-sectional view, another example system-in-package (SiP) structure, in accordance with the principles of the present disclosure.

FIG. 7 illustrates, in a cross-sectional view, another example system-in-package (SiP) structure (e.g., SiP 700), in accordance with the principles of the present disclosure.

SiP 700 includes three semiconductor die—a first die (e.g., die 20), a second die (e.g., die 30) and a third die (e.g., die 40). All three die (e.g., die 20, die 30 and die 40) are supported on, and electrically connected by, an interposer substrate (e.g., interposer substrate 10). Interposer substrate 10 may be coupled to the first semiconductor die (e.g., die 20) and the second semiconductor die (e.g., die 30) by contact pads 14 (as in SiP 100, FIG. 1). In example implementations, the third semiconductor die (e.g., die 40) in SiP 700 is disposed (e.g., in a flip chip orientation) on a top side of die 30 and coupled to die 30, for example, via contact pads 41. Die 30 may include TSVs (not shown) that can electrically interconnect the second and the third semiconductor die 30, 40 (and the interposer substrate 10). All three die (e.g., die 20, die 30 and die 40) are encapsulated (i.e., fully encapsulated) in a layer of molding material (e.g., layer 50).

In example implementations, instead of disposing die 40 directly on top of die 30, an additional carrier (e.g., another interposer substrate) (not shown) carrying die 40 may be disposed on top of the second semiconductor die 30. The additional carrier may be electrically connected to free or unused interconnects 14 on first side 11 of interposer substrate 10. The free or unused interconnects 14 may be located adjacent to first and second semiconductor die 20, 30 on first side 11. The additional carrier can then provide electrical interconnection between the third semiconductor die 40, the second semiconductor die 30 and/or any other element within SiP 700.

Figure 8:
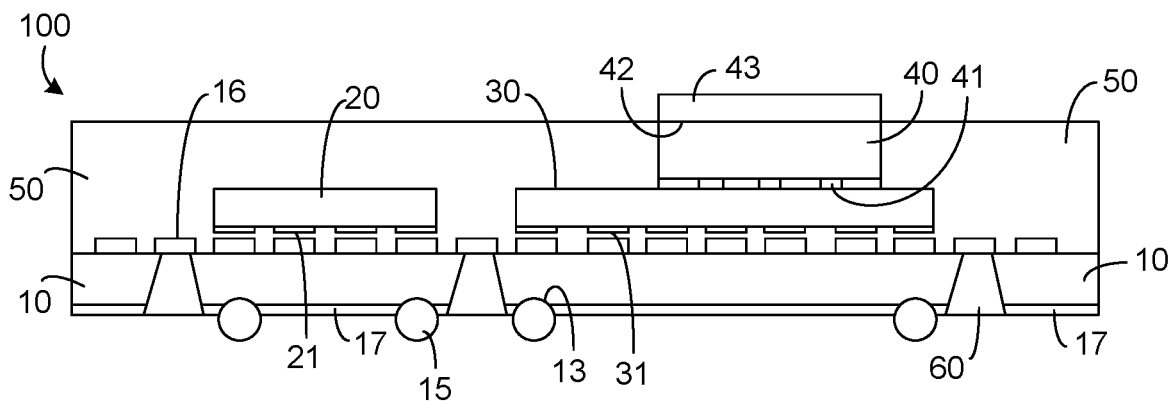
FIG. 8 illustrates, in a cross-sectional view, yet another example system-in-package (SiP) structure, in accordance with the principles of the present disclosure.

FIG. 8 illustrates, in a cross-sectional view, another example system-in-package (SiP) structure (e.g., SiP 800), in accordance with the principles of the present disclosure.

SiP 800 (like SiP 700, FIG. 7) includes three semiconductor die—a first die (e.g., die 20), a second die (e.g., die 30) and a third die (e.g., die 40). All three die (e.g., die 20, die 30 and die 40) are supported on, and electrically connected by an interposer substrate (e.g., interposer substrate 10) with die 40 disposed on top of die 30. However, in SiP 800 (unlike in SiP 700), the three die are not fully encapsulated in the layer of molding material (e.g., layer 50). Die 40 (disposed on top of die 30) has a bottom side 42 exposed through the layer of molding material (e.g., layer 50) for example, for heat dissipation. In example implementations, a heat spreader or heat slug 43 may be disposed on the exposed bottom side (e.g., bottom side 42) to help dissipate heat from die 40.

FIGS. 9A through 10C illustrate a variety of patterns of first chip area 71 and second chip area 72, and terminals 13, that may be disposed on the second side (side 12) of interposer substrate 10 in the foregoing SiP implementations. First chip area 71 and second chip area 72 may be defined or delimited by the TSVs (e.g., TSVs 60) extending from second side 12 to first side 11 across the thickness of interposer substrate 10.

Figures 9A, 9B:
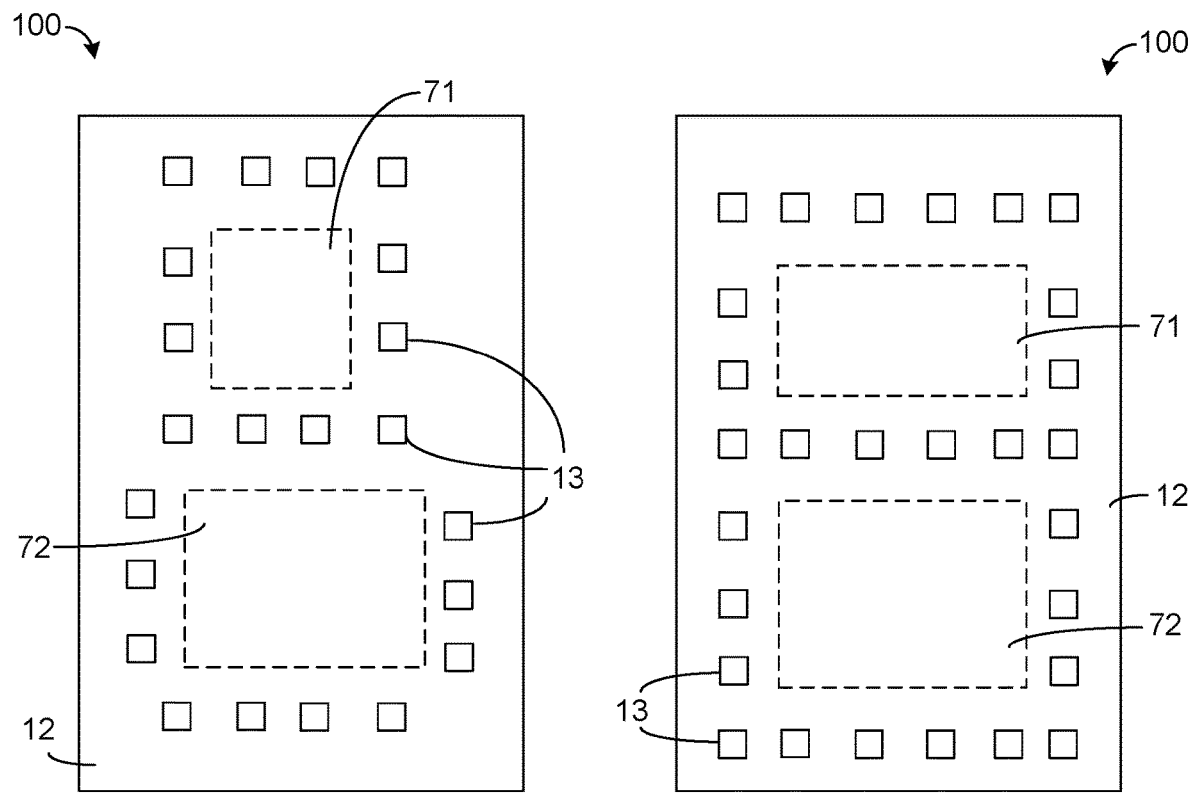
FIGS. 9A, 9B, and 10A illustrate, for example, plan views of a second side of an interposer substrate in a SiP structure.
Figure 10A:
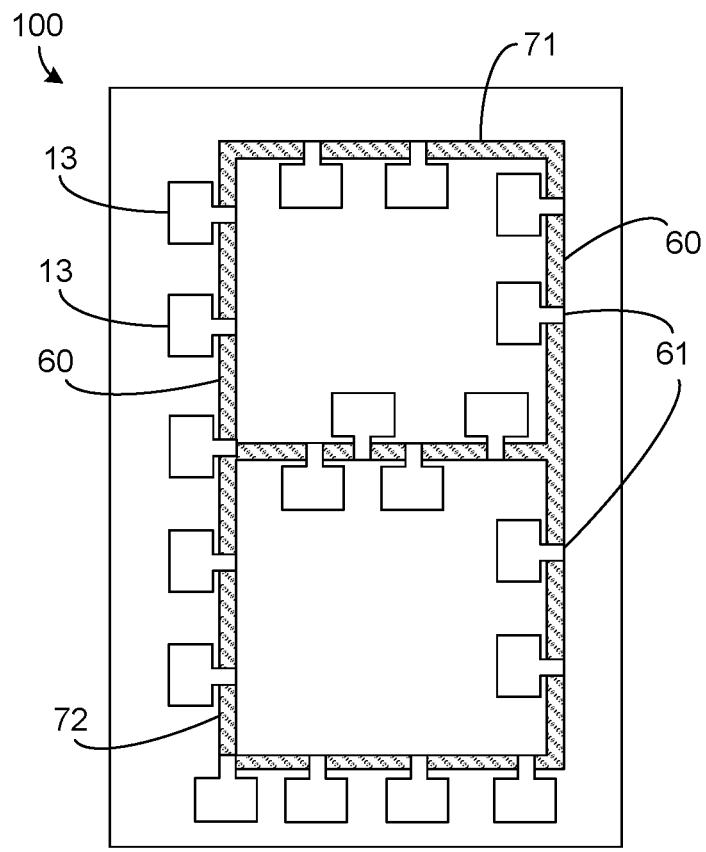

FIGS. 9A, 9B, and 10A show, for example, plan views of the second side 12 of interposer substrate 10. In the example shown in FIGS. 9A and 9B, terminals 13 are depicted as squares distributed around first chip area 71 and second chip area 72 (FIG. 1). The first chip area 71 and second chip area 72 are demarcated by dashed lines representing TSVs 60 (not shown). Interconnections through the TSVs in the pattern shown in FIGS. 9A and 9B can result in an effective interconnect length through the SIP (e.g., SiP 100) being kept at a minimum.

In the example shown in FIG. 9B, first chip area 71 and second chip area 72 arranged to have a same or similar width. The feature that the first and second chip areas 71, 72 have the same width may enable disposition of the TSVs (e.g., TSV 60) and terminals (e.g., terminals 13) in pattern with an annular ring shape (i.e., a symmetrical annular rectangular pattern) as shown in FIG. 9B. Terminals 13 may be disposed outside or inside the first and second chip areas 71, 72.

FIG. 10A shows, for example, a plan view of another example of the second side 12 of interposer substrate 10. In the example shown in FIG. 10A, TSV 60 is not embodied as a symmetrical round or dot-shaped TSV, but rather as a line-shaped TSV or groove, which extends around (and defines) the first and second chip areas 71, 72. The line-shaped TSV or groove may not fully extend from the first side to the second side of interposer substrate 10. Instead in some example implementations, the line-shaped TSV or groove may be embodied as a trench that extends into the interposer substrate 10 from its second side 12. Such a line- or groove-shaped implementation of the TSV can be beneficial for minimizing stress and strain due to thermal cycling and differential thermal expansion.

As shown in FIG. 10A, terminals 13 may be located on either side of the groove-shaped aperture (e.g., TSV 60). Thus, terminals 13 can be either within the first or second chip areas 71, 72 or in the edge area 73. An interconnect 61 may be provided as a (conductive layer) pattern extending on a side wall of TSV 60 and connected to a terminal 13.

Figure 10B:
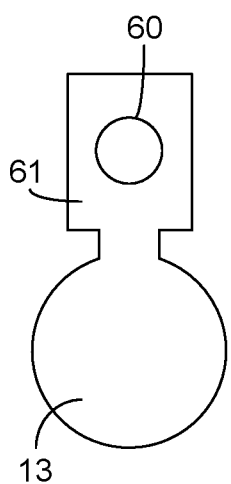
FIGS. 10B and 10C illustrate example shapes and structures of terminals that may be used in a multi-die SiP package.
Figure 10C:
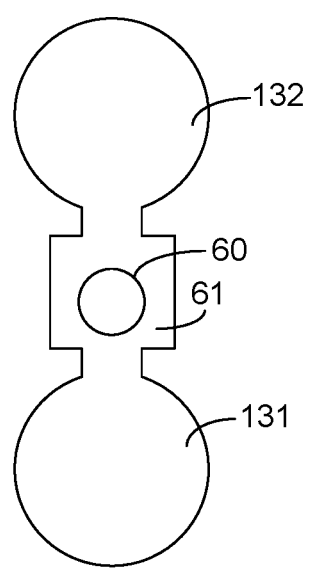

FIGS. 10B and 10C show example shapes and structures of terminals 13 that may be used, for example, in SiP 100. An advantage of the implementations of FIGS. 10B and 10C is that one interconnect (e.g., interconnect 61) is defined per TSV 60. The one interconnect can be formed by a single conductive layer applied onto the entire inner surface of TSV 60 (in other words, no patterning within the TSV is necessary). However, interconnect 61 may be patterned on the second side of interposer substrate 10.

FIG. 10B shows an example patterning for interconnect 61 which gives a round shape to a terminal 13 on the second side of the interposer substrate.

FIG. 10C shows an example patterning for interconnect 61 which defines a double terminal, i.e., a first and a second terminal 131, 132, connected to a single interconnect 61. In example implementations, TSV 60 may have a diameter of about 50 µm. Further, terminal 13 and first and second terminal 131, 132 may have linear dimensions of about 100 µm.

In a general aspect, a semiconductor device assembly can include an interposer substrate, a first and a second semiconductor die and an encapsulation. The interposer substrate can have a first and a second opposed side, at which second side terminals are present for assembly to a carrier, at which first side contact pads are present, wherein the interposer substrate can comprise a semiconductor material and can be provided with interconnects extending from the contact pads on the first side to terminals on the second side through one or more apertures in the interposer substrate. The first and the second semiconductor die can be mounted to the first side of the interposer substrate on first and second chip areas respectively, which die can each be provided with contact pads, which are electrically coupled to said contact pads on the interposer substrate. The encapsulation using a molding compound can be configured to encapsulate said first and said second semiconductor die Example implementations can include the following features. The apertures can be arranged outside the first and second chip areas. The one or more apertures can include at least one aperture arranged circumferentially to said first chip area, wherein a plurality of interconnects are defined through a single aperture. An aperture through the interposer substrate can be provided with a wall surface, and wherein an aperture comprises a single interconnect covering said wall surface of the aperture at least substantially and further extending on the second side of the interposer substrate to a terminal thereon.

In example implementations, the interposer substrate can have a thickness of at most 35 micrometers. The encapsulation can have a thickness in the range of 100-150 micrometer. The first and second semiconductor die can be mounted on the interposer substrate with the contact pads of the semiconductor die facing toward the interposer substrate, and electrical connections are present between the contact pads of the first and second semiconductor die and corresponding contact pads on the interposer substrate.

In example implementations, a molded support structure can be provided in an edge area on the first side of the interposer substrate. The molded support structure can further cover apertures arranged between one of said first and second chip areas and said edge area.

A method of manufacturing a plurality of semiconductor device assemblies can include the steps of providing an interposer substrate made of a semiconductor material and provided with a first and an opposed second side, wherein said interposer substrate is a wafer substrate comprising a plurality of units each provided with a first and a second chip area; thinning the interposer substrate from its second side; mounting a first and a second semiconductor die to the first side of the interposer substrate, which die are each provided with contact pads, which are electrically coupled to said contact pads on the interposer substrate; encapsulating said first and said second semiconductor die with a molding compound; applying apertures in said interposer substrate extending from the second side to the first side; applying conductive material in said apertures and extending on said second side of the interposer substrate, therewith creating interconnects from said contact pads on said first side to terminals areas on said second side of the interposer substrate, and singulating said molded substrate into individual semiconductor device assemblies.

Example implementations can include one or more of the following features and/or one or more of the features mentioned hereinabove with respect to the assembly. The thinning can be performed such that substrate protrusions remain and extend from thinned portions of the interposer substrate, said substrate protrusions being arranged between a first and a second unit, and wherein said singulating can be performed such that said substrate protrusions remain outside the semiconductor device assemblies. Said removal of substrate protrusions can occur after providing solder material on the terminal areas on the second side of the interposer substrate. The apertures can be arranged outside the first and the second areas.

The apertures can be applied into the interposer substrate prior to mounting the first and the second semiconductor die. The method can include applying an support structure to the first side of the interposer substrate prior to the mounting of the first and the second semiconductor die, said support structure being configured to leave the first and second chip areas exposed. The support structure can be applied by means of film assisted molding (FAM). The support structure can cover apertures defined adjacent to edge areas of said first and second units.

The apertures can be applied into the interposer substrate after applying the encapsulation. The method can include planarizing a top side of the encapsulation. The planarization can be performed by grinding.

In another general aspect, a method of manufacturing a plurality of semiconductor devices include: providing an interposer substrate comprising a semiconductor material and provided with a first and an opposed second side, wherein said interposer substrate is a wafer substrate comprising a plurality of units each provided with a first and a second chip area, wherein said interposer substrate is provided with apertures extending from the second side to the first side, wherein said interposer substrate is provided with support structures arranged in between of said units; mounting first and second semiconductor die to the first side of the interposer substrate on said first and second chip areas respectively, which die are each provided with contact pads, which are electrically coupled to said contact pads on the interposer substrate; encapsulating said first and said second semiconductor die using a molding compound to obtain a molded substrate, applying conductive material in said apertures and extending on said second side of the interposer substrate, therewith creating interconnects from said contact pads on said first side to terminals areas on said second side of the interposer substrate; singulating said molded substrate into individual semiconductor device assemblies, wherein said support structures remain at least partially outside of the individual semiconductor devices.

Example implementations can include one of more of the following features and/or one or more of the features mentioned hereinabove. The support structure can include at least one of a molded support structure arranged on at least one of the first and the second side of the interposer substrate, a printed support structure arranged on at least one of the first and the second side of the interposer substrate, a substrate protrusion on the second side of the interposer substrate remaining after thinning down portions of the interposer substrate from the second side, said portions including the first and second chip areas. The support structure can include a molded support structure on the first side of the interposer substrate and a further support structure on the second side of the interposer substrate. The support structure can comprise a molded support structure on the first side of the interposer substrate and a substrate protrusion on the second side of the substrate. The shape of the support structure on the first substrate can be identical or different to the shape of the support structure on the second side of the substrate. The support structure on the first side of the substrate can overlap with the support structure on the second side of the substrate when seen in a perpendicular projection on the substrate (i.e., when seen from below or above). The shape of one of the support structure on the first side and on the second side may be a structure of walls extending between individual units. The shape of one of the support structures on the first side and on the second side may be a structure in the form of posts arranged between individual units.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising," and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

What is claimed is:

1. A method, comprising:
   forming a wafer-level interposer substrate having a first side and a second side opposite the first side, the wafer-level interposer substrate includes a support structure in an edge area on the first side;
   forming a through-substrate via (TSV) extending between the first side and the second side of the wafer-level interposer substrate;
   flip chip mounting at least two semiconductor die on the first side of the wafer-level interposer substrate;
   encapsulating the at least two semiconductor die mounted on the first side of the wafer-level interposer substrate in a layer of molding material; and
   singulating a wafer-level assembly of the wafer-level interposer substrate and the layer of molding material encapsulating the at least two semiconductor die mounted on the wafer-level interposer substrate to produce at least one individual system-in-package including the at least two semiconductor die.

2. The method of claim 1, wherein the wafer-level interposer substrate is a silicon wafer, and wherein forming the wafer-level interposer substrate includes thinning the silicon wafer to a thickness of less than about 50 μm.

3. The method of claim 2, wherein thinning the silicon wafer includes forming substrate protrusions extending perpendicularly from the second side of the wafer-level interposer substrate.

4. The method of claim 1, wherein forming the wafer-level interposer substrate includes forming a redistribution layer including a plurality of contact pads and interconnection pads on the first side of the wafer-level interposer substrate.

5. The method of claim 1, wherein forming the TSV extending between the first side and the second side of the wafer-level interposer substrate includes disposing conductive material in the TSV to form a conductive path between the first side and the second side of the wafer-level interposer substrate.

6. The method of claim 1, further comprising:
   attaching conductive bumps to terminals disposed on the second side of the wafer-level interposer substrate.

7. A method, comprising:
disposing a redistribution layer including contact pads and interconnection pads on a first side of a semiconductor wafer;
mounting a first semiconductor die and a second semiconductor die on the redistribution layer on the first side of the semiconductor wafer;
encapsulating the first semiconductor die and the second semiconductor die on the first side of the semiconductor wafer in a layer of molding material;
thinning the semiconductor wafer from a second side opposite the first side;
forming at least a through-semiconductor via (TSV) extending between the first side and the second side of the semiconductor wafer;
forming an interconnection including a terminal on the second side of thinned semiconductor wafer; and
singulating an assembly of the semiconductor wafer and the layer of molding material to produce an individual unit of a system-in-package (SiP) that includes the first semiconductor die and the second semiconductor die integrated on the semiconductor wafer.

8. The method of claim 7, wherein thinning the semiconductor wafer from the second side opposite the first side includes forming substrate protrusions extending from the second side of the semiconductor wafer.

9. The method of claim 7, wherein thinning the semiconductor wafer from the second side opposite the first side includes disposing a dam-like support structure made of a molding material in an edge area on the first side of the semiconductor wafer.

10. A method, comprising:
disposing a redistribution layer on a first side of a substrate, the redistribution layer including a plurality of contact pads and a plurality of interconnections on the first side, the plurality of interconnections being electrically connected to a plurality of terminals disposed on a second side of the substrate opposite the first side;
disposing a first semiconductor die on the first side, the first semiconductor die being electrically coupled to a first of the plurality of contact pads and a first of the plurality of interconnections of the redistribution layer;
disposing a second semiconductor die on the first side, the second semiconductor die being electrically coupled to a second of the plurality of contact pads and a second of the plurality of interconnections of the redistribution layer; and
disposing a third semiconductor die on and coupled to the second semiconductor die, wherein a bottom side of the third semiconductor die is exposed through a layer of molding material disposed on the first side.

11. The method of claim 10 further comprising:
forming a through substrate via providing a conductive pathway for electrical interconnection between the first side and the second side of the substrate.

12. The method of claim 11, wherein the through substrate via is at least partially filled with electrically conductive material including at least one of a metal paste and a laminate of titanium nitride (TiN) and aluminum (Al) or copper (Cu).

13. The method of claim 10, wherein the substrate has a thickness of less than 50 micrometers.

14. The method of claim 10 further comprising:
forming a layer of molding material disposed on the first side of the substrate, the layer of molding material encapsulating the first semiconductor die and the second semiconductor die.

15. The method of claim 14, wherein the layer of molding material has a thickness in a range of 100 to 150 micrometers.

16. The method of claim 10, wherein the second semiconductor die is disposed on the first side in a flip chip orientation.

17. The method of claim 10 further comprising:
disposing a conductive bump on at least one of the plurality of terminals disposed on the second side.

18. The method of claim 10 wherein the third semiconductor die is disposed in a flip chip orientation on and is electrically coupled to the second semiconductor die.

19. The method of claim 18, wherein the first semiconductor die, the second semiconductor die, and the third semiconductor die are encapsulated in the layer of molding material disposed on the first side.

20. The method of claim 19, further including disposing a heat slug on the bottom side of the third semiconductor die.

21. A method, comprising:
forming a wafer-level interposer substrate having a first side and a second side opposite the first side, wherein the wafer-level interposer substrate is a silicon wafer thinned to a thickness of less than about 50 μm;
forming a through-substrate via (TSV) extending between the first side and the second side of the wafer-level interposer substrate;
flip chip mounting at least two semiconductor die on the first side of the wafer-level interposer substrate;
encapsulating the at least two semiconductor die mounted on the first side of wafer-level interposer substrate in a layer of molding material; and
singulating a wafer-level assembly of the wafer-level interposer substrate and the layer of molding material encapsulating the at least two semiconductor die mounted on the wafer-level interposer substrate to produce at least one individual system-in-package including the at least two semiconductor die.

22. The method of claim 21, wherein thinning the silicon wafer includes forming substrate protrusions extending perpendicularly from the second side of the wafer-level interposer substrate.

23. The method of claim 21, wherein forming the wafer-level interposer substrate includes forming a redistribution layer including a plurality of contact pads and interconnection pads on the first side of the wafer-level interposer substrate.

24. The method of claim 21, wherein forming the wafer-level interposer substrate includes disposing a dam-like support structure made of molding material in an edge area on the first side of the wafer-level interposer substrate.

* * * * *